US007719906B2

(12) United States Patent
Tanimura et al.

(10) Patent No.: US 7,719,906 B2
(45) Date of Patent: May 18, 2010

(54) SEMICONDUCTOR DEVICE

(75) Inventors: Naoya Tanimura, Tokyo (JP); Tomohiko Sato, Tokyo (JP); Chiaki Dono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 117 days.

(21) Appl. No.: 12/175,618

(22) Filed: Jul. 18, 2008

(65) Prior Publication Data

US 2009/0021999 A1 Jan. 22, 2009

(30) Foreign Application Priority Data

Jul. 20, 2007 (JP) ............................ 2007-189767

(51) Int. Cl.
*G11C 7/00* (2006.01)

(52) U.S. Cl. ....................... 365/200; 365/222; 365/236; 365/201; 365/230.06

(58) Field of Classification Search ................ 365/200, 365/222, 236, 201, 230.03, 230.06, 230.08
See application file for complete search history.

(56) References Cited

U.S. PATENT DOCUMENTS

| | | | |
|---|---|---|---|
| 5,381,373 A | 1/1995 | Ohsawa | |
| 5,394,369 A | 2/1995 | Kagami | |
| 6,166,972 A * | 12/2000 | Hidaka | 365/200 |

FOREIGN PATENT DOCUMENTS

| | | |
|---|---|---|
| JP | 5210998 A | 8/1993 |
| JP | 5266059 A | 10/1993 |
| JP | 5342859 A | 12/1993 |

* cited by examiner

*Primary Examiner*—David Lam
(74) *Attorney, Agent, or Firm*—Sughrue Mion, PLLC

(57) ABSTRACT

Disclosed is a semiconductor storage device in which a cell array including a plurality of cells in need of refresh for data retention includes the redundancy area, which has a plurality of redundant cells for replacing faulty cells of a normal area within the cell array. When the redundancy area is tested, a refresh counter circuit for generating and outputting refresh addresses rearranges the address in such a manner that a row address of the redundancy area is substantially reduced and placed on a lower-order bit side inclusive of the LSB of the counter.

10 Claims, 7 Drawing Sheets

FIG. 2A REFERENCE CASE
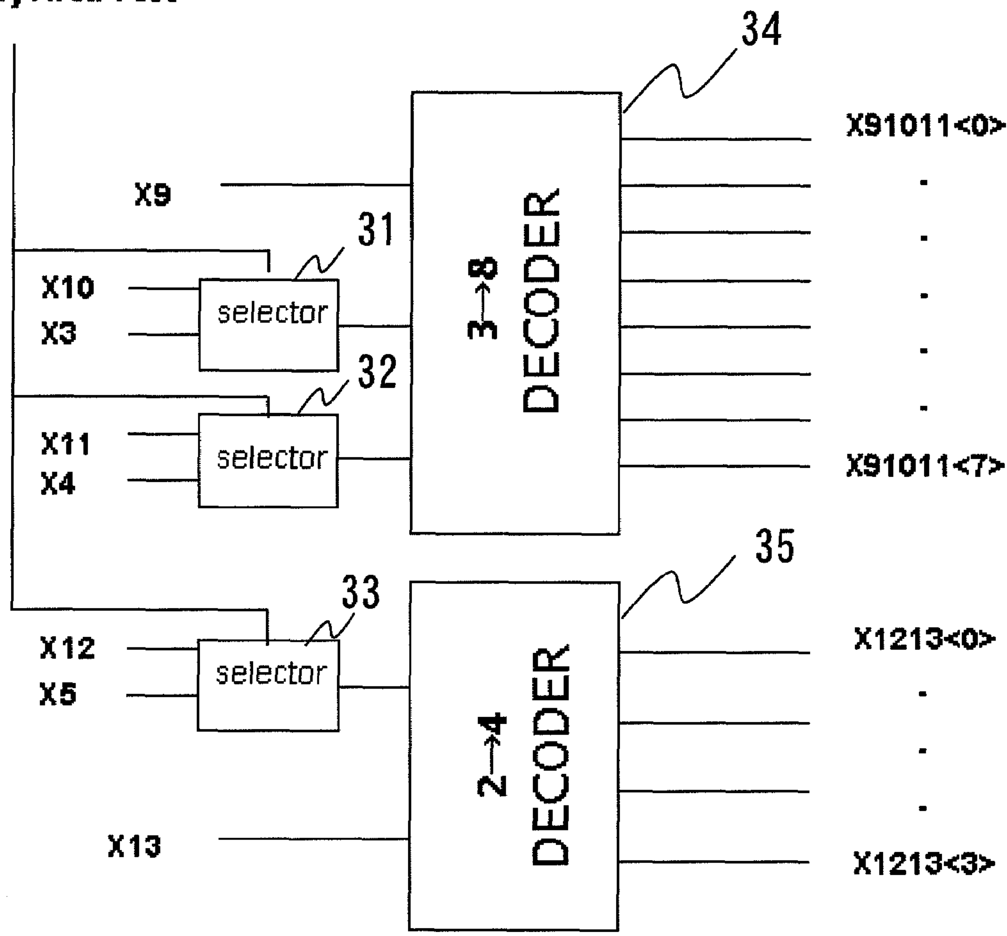
FIG. 2B
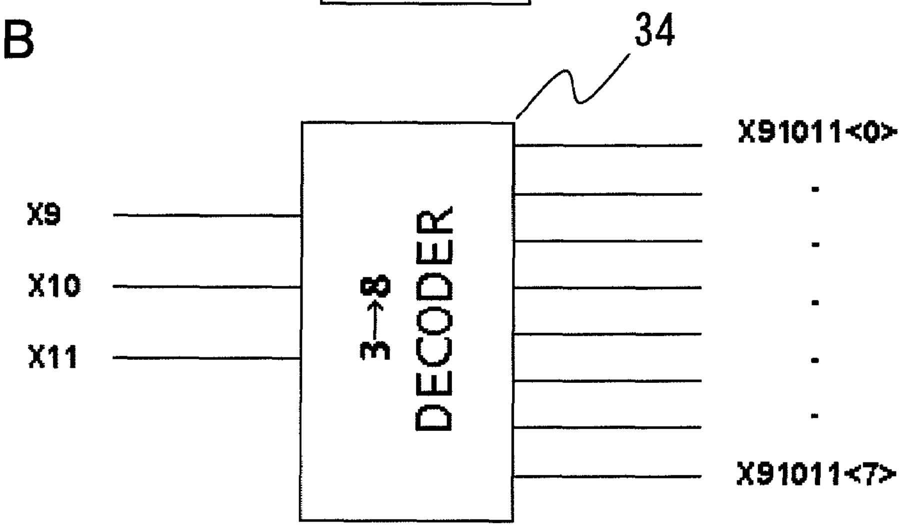

*X ADDRESS (A0,A1,A2,A10,A11,A12,A13) FOR REDUNDANCY AREA TEST

FIG. 4A

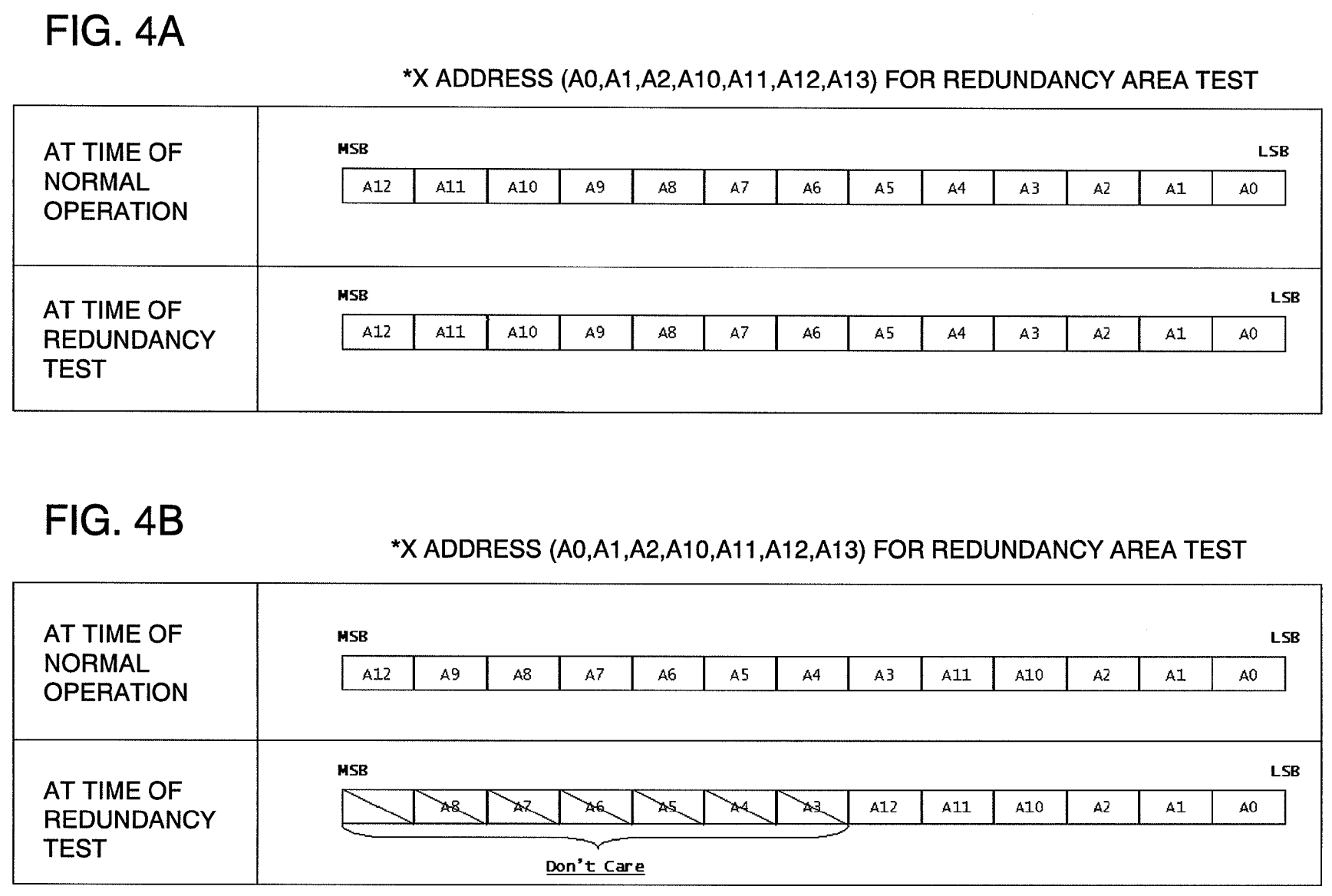

*X ADDRESS (A0,A1,A2,A10,A11,A12,A13) FOR REDUNDANCY AREA TEST

| | MSB | | | | | | | | | | | | LSB |
|---|---|---|---|---|---|---|---|---|---|---|---|---|---|
| AT TIME OF NORMAL OPERATION | A12 | A11 | A10 | A9 | A8 | A7 | A6 | A5 | A4 | A3 | A2 | A1 | A0 |
| AT TIME OF REDUNDANCY TEST | A12 | A11 | A10 | A9 | A8 | A7 | A6 | A5 | A4 | A3 | A2 | A1 | A0 |

FIG. 4B

*X ADDRESS (A0,A1,A2,A10,A11,A12,A13) FOR REDUNDANCY AREA TEST

| | MSB | | | | | | | | | | | | LSB |
|---|---|---|---|---|---|---|---|---|---|---|---|---|---|
| AT TIME OF NORMAL OPERATION | A12 | A9 | A8 | A7 | A6 | A5 | A4 | A3 | A11 | A10 | A2 | A1 | A0 |
| AT TIME OF REDUNDANCY TEST | | ~~A8~~ | ~~A7~~ | ~~A6~~ | ~~A5~~ | ~~A4~~ | ~~A3~~ | A12 | A11 | A10 | A2 | A1 | A0 |

Don't Care

REFERENCE CASE

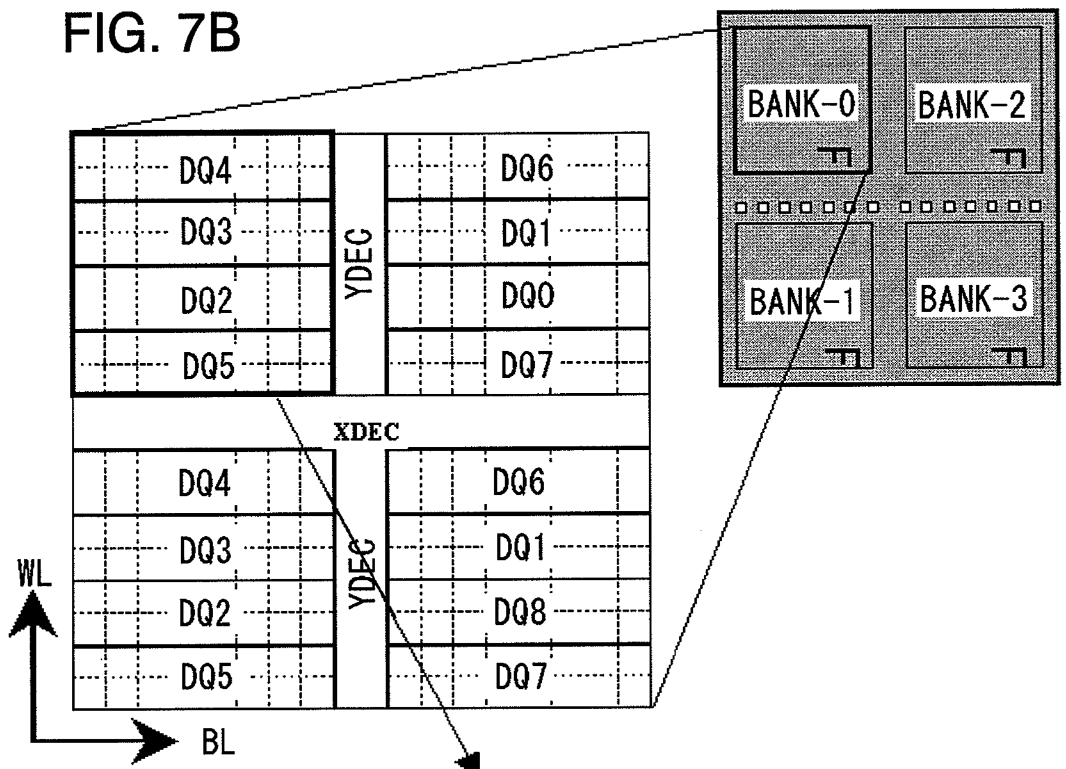
FIG. 7A
FIG. 7B
BANK-0
BANK-2
BANK-1
BANK-3
DQ4
DQ3
DQ2
DQ5
YDEC
DQ6
DQ1
DQ0
DQ7
XDEC
DQ4
DQ3
DQ2
DQ5
YDEC
DQ6
DQ1
DQ8
DQ7
WL
BL
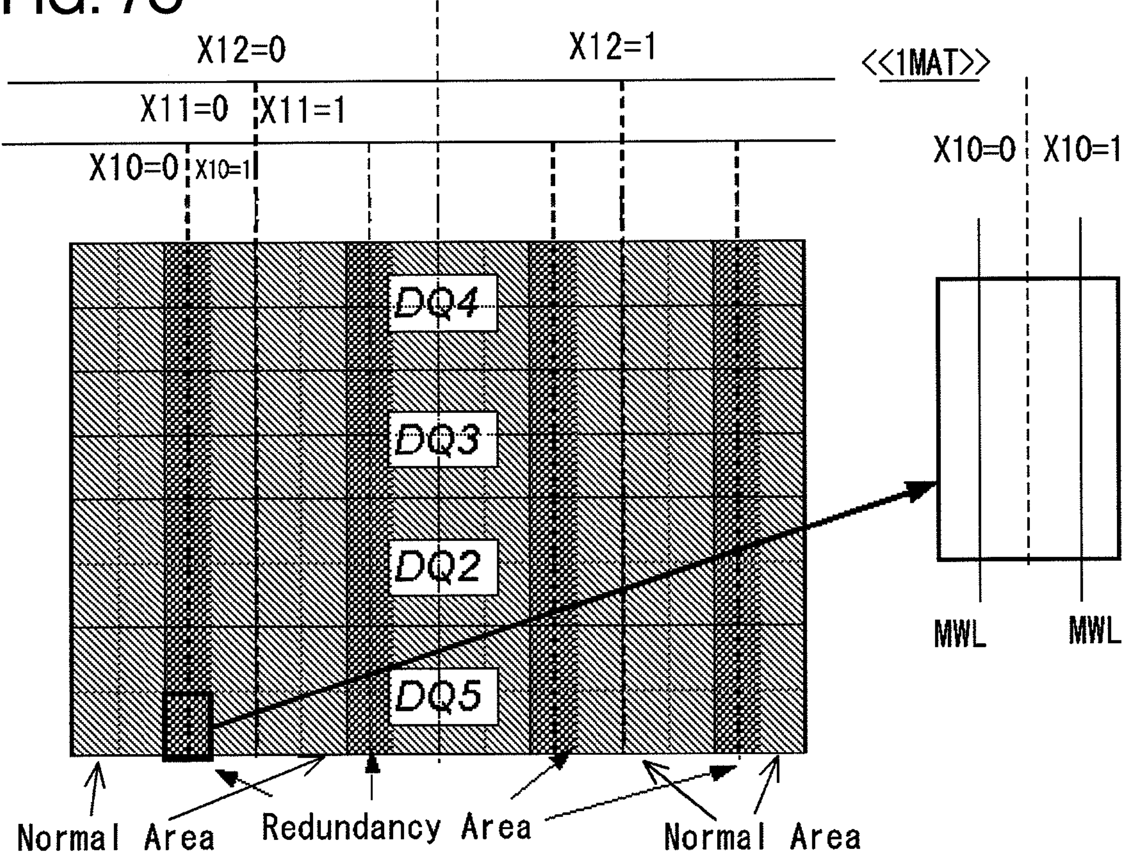
FIG. 7C
FIG. 7D
X12=0
X12=1
X11=0
X11=1
X10=0
X10=1
<<1MAT>>
X10=0
X10=1
DQ4
DQ3
DQ2
DQ5
MWL
MWL
Normal Area
Redundancy Area
Normal Area

SEMICONDUCTOR DEVICE

REFERENCE TO RELATED APPLICATION

This application is based upon and claims the benefit of the priority of Japanese patent application No. 2007-189767, filed on Jul. 20, 2007, the disclosure of which is incorporated herein in its entirety by reference thereto.

BACKGROUND OF THE INVENTION

1. Field of the Invention

This invention relates to a semiconductor device and, more particularly, to a semiconductor device having a memory that includes cells in need of refresh for data retention.

2. Description of Related Art

In a DRAM (Dynamic Random-Access Memory) provided with redundant cells for rescuing faulty cells, a faulty cell detected by for example a wafer test, is replaced with a redundant cell. More specifically, a word line of a faulty cell is replaced with a redundant word line in a redundancy area by fuse programming (fuse blowing) of a redundancy decoder circuit. As a result, when an X address (row address) to be accessed matches an X address of the faulty cell, a redundancy decoder circuit selects a redundant word line in the redundancy area based upon the fuse-programmed information and accesses the redundant word line instead of the word line of the faulty cell.

As an example of the related art, Patent Document 1 (JP Patent Kokai Publication No. 05-342859) describes an arrangement having a circuit for receiving a test mode signal, exercising control in such a manner that only higher-order bits (nine higher-order bits) higher than a specific bit of the output signal of a refresh address counter are fixed at the same level, and exercising control in such a manner that lower-order bits (two lower-order bits) are changed by counter operation, wherein when a CBR(CAS before RAS) cycle is executed, higher-order bits (nine higher-order bits) of an internal row address are fixed at HIGH, only lower-order bits are changed and only some word lines are selected. As an example of manipulating bit position, Patent Document 2 discloses an arrangement in which an address generator for FFT (Fast-Fourier Transform) computation includes a rearranging unit in which the order of bits from the most significant bit to the least significant bit of a parallel register is reversed. With regard to a test of a redundancy arrangement, see the description of Patent Document 3, etc.

[Patent Document 1]
JP Patent Kokai Publication No. JP-A-05-342859

[Patent Document 2]
JP Patent Kokai Publication No. JP-A-05-266059

[Patent Document 3]
JP Patent Kokai Publication No. JP-A-05-210998

SUMMARY

The description set forth below is the result of analysis by the inventor. The description relates to problems that arise in a case where a redundancy area is refreshed using a refresh address counter circuit which generates a refresh address for a normal area in testing a DRAM device. The refresh address counter circuit will be referred to as a "refresh counter circuit".

A redundancy area has a narrower address range in comparison with a normal area in the cell array. For example, whereas the number of word lines of a normal area is, e.g., 8K (8192), the number of word lines of a redundancy area is, e.g., 64. Consequently, in a case where all word lines of a redundancy area are refreshed, the refresh counter circuit must be made to perform a counting operation needlessly, with the result that time is wasted in testing. This makes difficult to reduce test time. This problem will now be described more in detail.

When the count value (used as a refresh address) of the refresh counter circuit corresponds to a certain word line in the redundancy area, redundant cells commonly connected to the selected word line in the redundancy area are refreshed. After this refreshing of the word line in the redundancy area, responsive to the next refresh command, the refresh counter circuit increments its count value. If the incremented count value (refresh address) corresponds to a word line in the normal area in the cell array, then this cycle becomes a wasted cycle in testing the redundancy area. That is, all refresh operations for refreshing of the normal area until the refresh counter circuit further counts up to a next count value corresponding to a word line in the redundancy area are wasteful. Reference will be had to FIG. 3A to describe the refreshing of a redundancy area. Assume that A0, A1, A2, A10, A11, A12, and A13 constitute an X address in a case where the count value of a refresh counter circuit used in normal operation is employed for refreshing a redundancy area. However, when a refresh command is entered, A13 is selected at the same time, and therefore A13 is not included in the address constituents.

With regard to a refresh address represented by a count value of the refresh counter circuit, as illustrated in FIG. 3A, A0 to A12 of an X address are all used both in normal operation in which the redundancy area is not selected and in test operation of the redundancy area (see "Redundancy Area" in FIG. 3A).

The redundancy area has 64 word lines which are selected by 6 bits A0, A1, A2, A10, A11 and A12 of the output of the refresh counter circuit. When the redundancy area is tested, therefore, a counting operation must be performed by the refresh counter circuit up to unnecessary addresses where the redundancy area is not selected. More specifically, referring to FIG. 3A, the refresh counter counts up responsive to a refresh command supplied thereto as a count clock to produce first 32 refresh addresses of from #0000 to #001F (where a symbol # indicates hexadecimal representation) for a first part redundancy area in the cell array and then to produce refresh addresses of #0020 to #0FFF for a normal area in the cell array, by which no redundancy area is selected. In FIG. 3A, pulses denoted by Ref at respective addresses indicate the refresh pulses (or refresh events). The refresh counter further counts up to produce more 32 refresh addresses of from #1000 to #101F for the next part redundancy area in the cell array and then to produce refresh addresses: #1020 to #1FFF for the normal area, by which no redundancy area is selected. After counting up to #1FFF, the refresh counter counts up, responsive to a refresh command to #0000.

That is, there is inserted between refresh operations of the redundancy area an operation in which the refresh counter circuit counts up and a refresh address for refreshing cells connected to the world line in the normal area unnecessary in a test of the redundancy area is generated.

In order to perform a refresh operation for 64 word lines in the redundancy area, the refresh counter circuit must perform a count operation for the equivalent of a total of 8K (8192) word lines. As a result, it is very difficult to reduce test time at refreshing of a redundancy area, in a wafer test, etc.

The present invention disclosed in this application has the structure set forth below.

According to the present invention, there is provided a semiconductor storage device in which, when a redundancy area is subjected to a test, the arrangement of bits of a refresh counter circuit is rearranged in such a manner that the refresh counter circuit will output addresses of a redundancy area successively without the address of a normal area being inserted between them.

The refresh counter circuit in one mode of the present invention may rearrange address, when the redundancy area is tested, in such a manner that a row address of the redundancy area is reduced and placed on neighboring lower-order bits including the least significant bit (LSB) of a count output of the refresh counter circuit.

In accordance with the present invention, when a refresh test of a redundancy area is conducted, the configuration of a refresh counter circuit can be changed in such a manner that only enough addresses of a redundancy area are successively generated. As a result, the refresh test is speeded up.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 2A and 2B are diagrams useful in describing an example for comparison and the configuration of an exemplary embodiment according to the present invention, respectively;

FIGS. 4A and 4B are diagrams useful in describing related art and address constituents according to an exemplary embodiment;

FIGS. 7A to 7D are diagrams illustrating the configuration in a memory device according to an exemplary embodiment of the present invention.

DETAILED DESCRIPTION OF THE PREFERRED EMBODIMENTS

A preferred exemplary embodiment of the present invention will be described in detail with reference to the drawings. In the present invention, a cell array having a plurality of cells in need of refresh for data retention includes a redundancy area having a plurality of redundant cells for replacing faulty cells of a normal area within the cell array. When the redundancy area is tested, a refresh counter circuit which generates refresh addresses for the normal area, rearranges addresses in such a manner that an address of the redundancy area is placed on a lower-order bit side that includes the LSB of the counter.

When the test of the redundancy area is tested, refresh of word lines of the redundancy area is performed successively, based upon refresh addresses from the refresh counter circuit, owing to rearrangement of the addresses of the refresh counter circuit, and refresh of the normal area is not interposed between refreshes of word lines of the redundancy area.

In the present invention, the refresh counter circuit has changeover means (41, 42) which, when a redundancy area test mode signal is input as a selection control signal and the redundancy area is subjected to a test, changes over a carry output from a flip-flop of a prescribed bit, which constitutes the refresh counter circuit, in such a manner that the carry output is made available for use in counting by a flip-flop corresponding to an adjacent higher-order bit of a row address of the redundancy area without the carry output being uses as a count input of a flip-flop of an adjacent higher-order bit at the time of normal operation.

More specifically, in a refresh test of a redundancy area, a refresh counter circuit used in a normal-area refresh operation is adapted so that the assignment of bits in the count output of the refresh counter circuit is changed in such a manner that only enough X addresses for the redundancy area are generated. As a result, when a test of the redundancy area is conducted, the refresh counter circuit does not generate row addresses of the normal area. A shorter test time is achieved.

Figure 1:
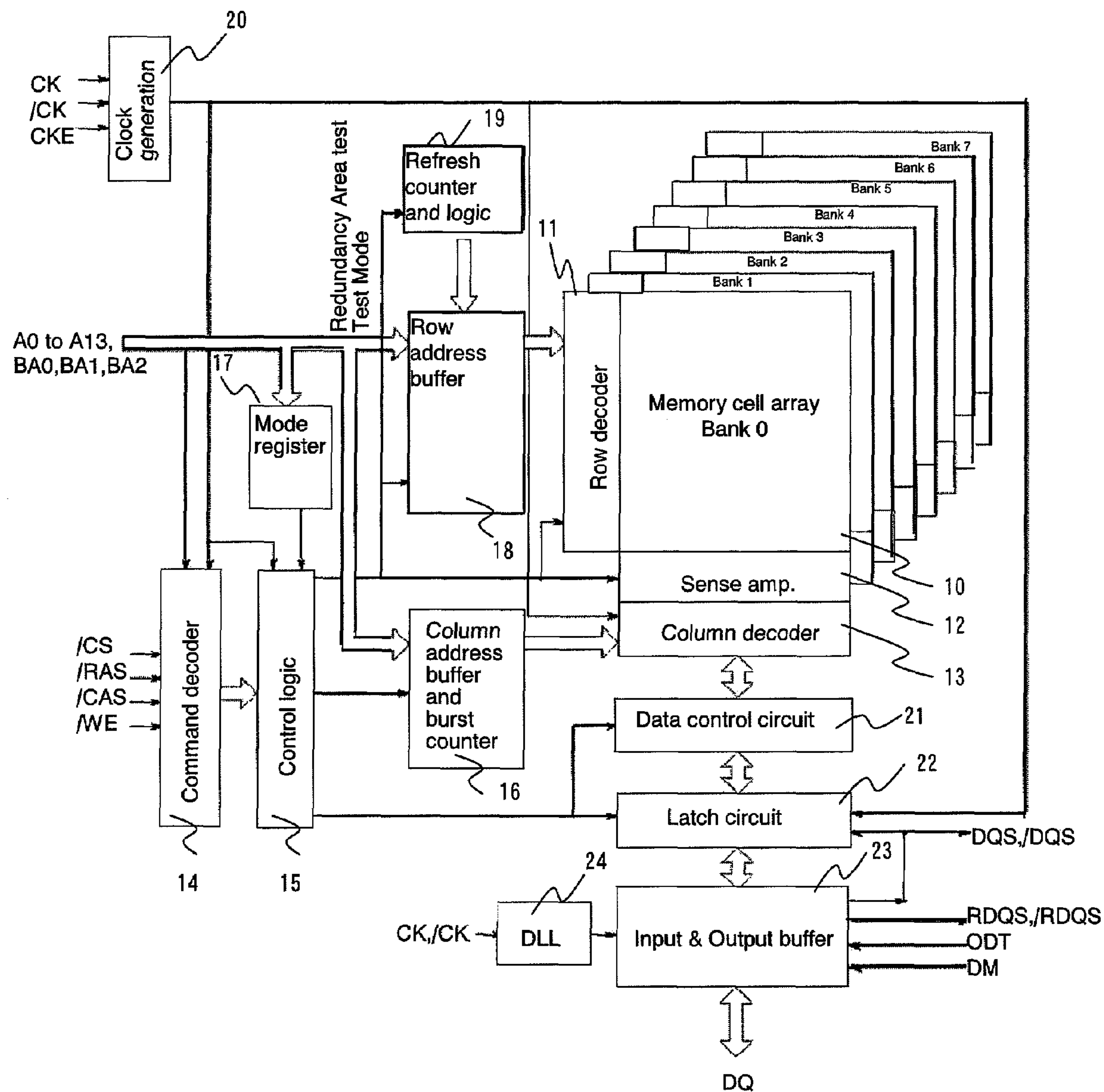
FIG. 1 is a diagram illustrating the overall configuration of a memory circuit to which the present invention is applied.

FIG. 1 is a diagram illustrating the overall configuration of a DRAM device according to an exemplary embodiment of the present invention. The DRAM device is assumed to be an 8-bank DDR (Double Data Rate) SDRAM (Synchronous DRAM). Shown in FIG. 1 are a memory cell array 10; a row decoder 11 for decoding row addresses and driving selected word lines; a sense amplifier 12; a column decoder 13 for decoding column addresses and selecting bit lines; a command decoder 14 which receives a prescribed address signal and, as control signals, chip select /CS, row address strobe /RAS, column address strobe /CAS and write-enable /WE, and which decodes commands; control logic 15; a column address buffer and burst counter 16; a mode register 17 which receives an input address A0 to A13 and signals BA0, BA1 and BA2 for bank selection (one bank among eight banks); a row address buffer 18; a refresh counter circuit (including a refresh counter and logic such as a selecting circuit) 19 which counts up responsive to a refresh command; a clock generator 20; a data control circuit 21 for input and outputting write data read data; a latch circuit 22 for latching write data and read data; an input/output buffer 23; and a DLL (Delay Lock Loop) 24. Further, DQ represents parallel data, DM is a write-data data mask signal, and DQS and /DQS are data strobe signals (I/O signals input and the time of write and output at the time of read. RDQS, /RDQS make an X8 configuration of data compatible with an X4 configuration. ODT (On Die Termination) represents a control signal for turning the termination of SQ, DQS, /DQS, RDQS, /RDQS on and off. The sense amplifier 12 amplifies cell data, which has been read out to a bit line connected to the cell of a word line selected by a refresh address at the time of a refresh operation, and writes the cell data back to the cell.

A redundancy-area test mode signal is output from the control logic 15, which receives the output signals of the command decoder 14 and mode register 17. The refresh counter circuit 19 receives the redundancy-area test mode signal and changes the assignment of bits in the count output of a refresh counter circuit (not shown) in such a manner that only enough X addresses (row addresses) for the redundancy area are generated. When the redundancy area is tested in this exemplary embodiment, the six lower-order bits (inclusive of the LSB) in the refresh counter circuit 19 are rearranged to address A0, A1, A2, A10, A11, and A12 for redundancy-area selection.

By rearranging the address of the refresh counter circuit 19 in this exemplary embodiment, addresses (row addresses of the normal area) unnecessary in the test of the redundancy area are reduced and test time needed for the refresh test of the entire redundancy area can be shortened. FIGS. 7A to 7D illustrate the configuration of the memory device according to the exemplary embodiment of the present invention in a hierarchical manner. Although no limitation is imposed on the present invention, the DRAM device shown in FIG. 7A includes Bank-0 to Bank-3. FIG. 7B illustrates the configuration of one bank (Bank-0) in FIG. 7A. The bank includes four memory mats. A row decoder (XDEC) decodes a row address (not shown) to activate a selected word line (not shown). A column decoder (YDEC) decodes a column address (not shown) to cause a column switch (not shown) connected to a selected bit line (not shown) to turn on. A vertical arrow designated by WL and a horizontal arrow designated by BL, respectively indicate the direction along which word lines and bit lines are arranged. FIG. 7C schematically illustrates the configuration of a memory mat (also termed as cell mat) with respect to of row address allocation according to the present example. Two bits X11 and X10 in a row address (X address) are used to designate a memory mat among four memory mats in the bank and the MSB X12 is used to select a memory block out of two memory blocks, for example, a left half block (X12=0) and a right half block (X12=1) in FIG. 7C. Referring to FIG. 7C, in a memory mat selected by (X10, X11)=(0, 0), in a memory block selected by X12=0, there are provided a redundancy area which has 8 word lines accessed by contiguous 8 row addresses and a normal area which has words lines each selected by the row address other than the row address for the redundancy area. A main word line MWL is provided for 8 word lines (also termed as subword lines). There is provided one main word line MWL for each eight word lines, and a sub-word decoder (not shown), to which the main word line MWL is supplied, decodes the lower three bits inclusive of LSB (X2, X1, X0) to select one out of 8 word line, when the MWL received is selected(activated). A main word line MWL is provided in a redundancy area in a memory mat selected by (X10, X11)=(0,0) for a block (X12=0). Therefore, in this example, each memory mat has two set of redundancy areas in correspondence with two blocks (X12=0/1), each redundancy area having 8 word lines (the word line in the redundancy is termed also as redundancy word line). Two main word lines MWL are provided for the two set of redundancy areas in a memory mat, as shown in FIG. 7D. One bank has 8K (8192) word lines, in which 8 sets of redundancy areas are disposed separately in terms of an address space of a row address, while each redundancy area has 8 word lines accessed by contiguous 8 row address.

FIG. 2A is a diagram illustrating the configuration of an example for comparison purposes. Here a different method of rearranging the addresses of the refresh counter circuit 19 is illustrated in an arrangement in which the refresh counter circuit 19 generates only enough X addresses (row addresses) for the redundancy area. The arrangement of FIG. 2A has selectors 31, 32 and 33. In regard to count output X0, X1, X2, X3, X4 and X5 of six lower-order bits of the refresh counter circuit 19, X3 and X10 are supplied to the selector 31, which outputs one of these addresses; X4 and X11 are supplied to the selector 32, which outputs one of these addresses; and X5 and X12 are supplied to the selector 33, which outputs one of these addresses, as illustrated in FIG. 2A. When the redundancy area is tested, the selectors 31, 32 and 33 select X10, X11 and X12, respectively, and output X0, X1, X2, X10, X11 and X12 as the six lower-order bits. It should be noted that X3-X5 and X9-X13 in FIG. 2A are output bits of a refresh counter circuit. The selectors 31, 32 and 33 output X10, X11 and X12, respectively, in the redundancy-area test mode (i.e., when a redundancy-area test signal indicates the redundancy-area test mode) and output X3, X4 and X5, respectively, in the normal mode.

However, in the case of the comparison example illustrated in FIG. 2A, control by a decoder circuit is necessary in order to select the redundancy area. That is, in addition to a 3 to 8 (3→8) decoder circuit 34 which receives and decodes X9, X10 (or X3), and X11 (or X5), a 2 to 4 (2→4) decoder circuit 35 which receives and decodes X12 (or X5) and X13 is provided. In other words, since the assignment of addresses differs between the normal area and the redundancy area, the additional 2 to 4 (2→4) decoder circuit 35 is provided. Thus, in the case of the comparison example, owing to the increase in decoder circuits and due to the selector circuits, there will be a delay in the write/read addresses in normal operation.

By contrast, in accordance with the present invention, owing to the fact that the addresses of the refresh counter circuit are rearranged, the 3 to 8 (3→8) decoder circuit 34 can be used as is as the decoder circuit which receives X9, X10 and X11, as illustrated in FIG. 2B. That is, in this exemplary embodiment, a selector circuit need not be placed in front of the 3 to 8 decoder circuit 34, unlike FIG. 2A, and there is no need to be concerned about a delay in normal operation.

Figure 3A:
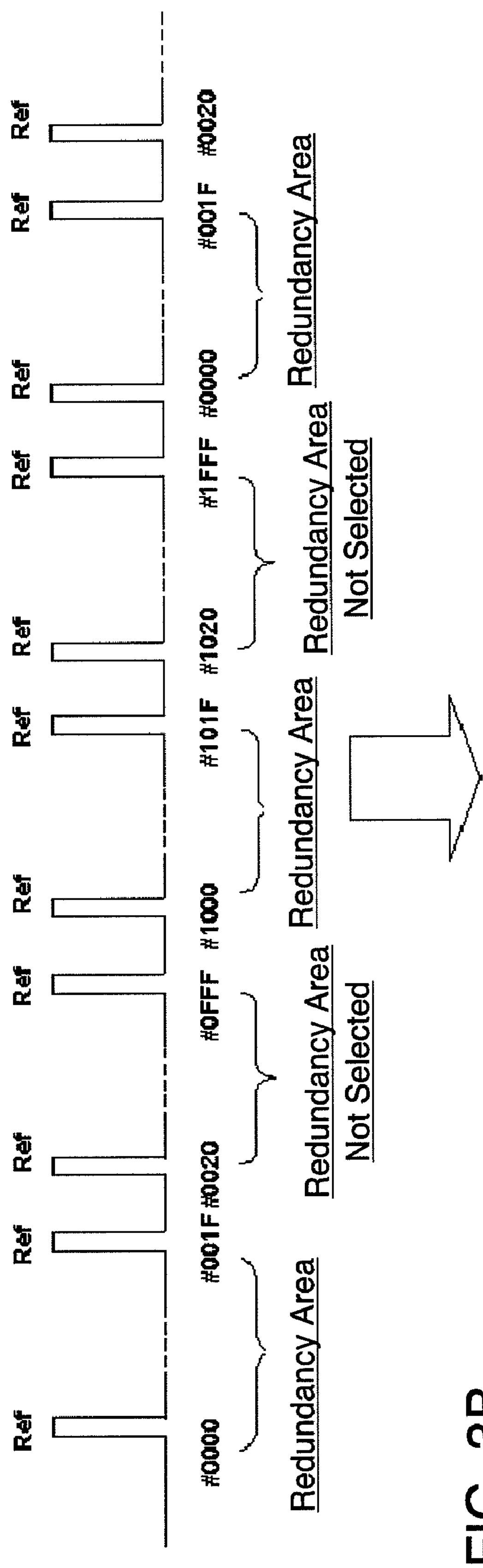
FIGS. 3A and 3B are diagrams useful in describing related art and redundancy area refresh according to an exemplary embodiment.
Figure 3B:
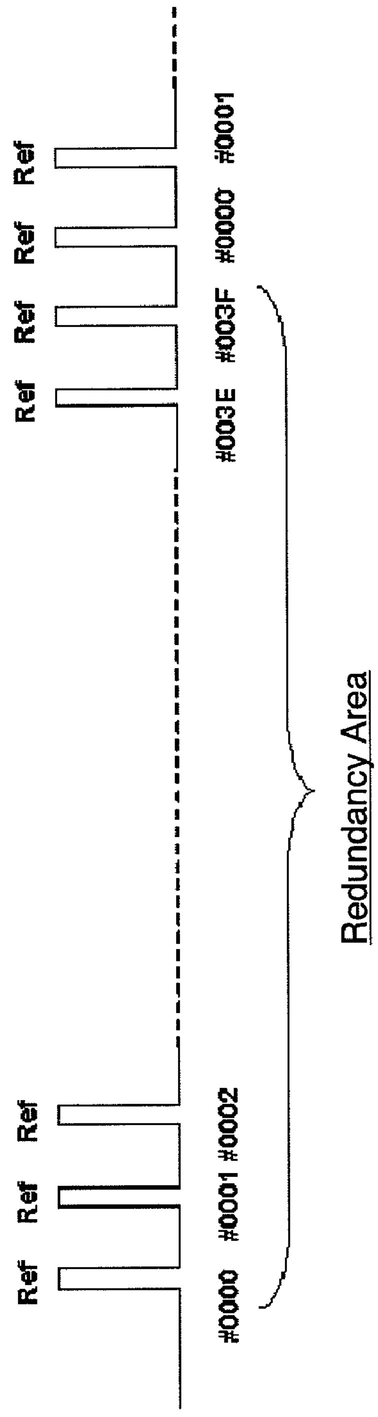

In this exemplary embodiment, addresses are rearranged, when the redundancy area is tested, in such a manner that the address constituents will be the minimum necessary to select the word lines of the redundancy area. Therefore, in a case where the redundant word lines of the redundancy area are, e.g., 64 in number, it is possible to refresh all of the redundant word lines of the redundancy area by the application of refresh commands 64 times. This makes it possible to shorten test time in, say, a wafer test. That is, by providing the refresh counter circuit used in normal operation with an additional function for changing the arrangement of the count outputs at the time of a redundancy test, test time can be shortened while an increase in the size of the circuit can be suppressed. In accordance with this exemplary embodiment, the operation for refreshing all word lines of the redundancy area is performed continuously, as shown for example in FIG. 3B, and the period of time over which the redundant word lines of the redundancy area are refreshed is not interrupted by an operation for refreshing the normal area. More specifically, referring to FIG. 3B, the refresh counter according to the present example, counts up, responsive to a refresh command supplied thereto as a count clock, to produce 64 refresh addresses of from #0000 to #003F for a redundancy area in a selected bank, contiguously. After counting up to #003F, the refresh counter counts up responsive to a refresh command, to #0000 or resets to 0. By contrast, in the comparison example (related art) that does not adopt the configuration of the present invention, intervals in which the redundancy area is not selected and the operation for refreshing the normal area is performed are inserted between operations for refreshing the redundant word lines of the redundancy area, as described earlier with reference to FIG. 3A. This leads to an increase in the length of test time.

In this exemplary embodiment, the refresh counter circuit configured to rearrange addresses when the redundancy area is tested has a greater number of stages and this results in some delay when the refresh operation is performed. However, there is no particular problem since there is enough timing margin (approximately 100 ns) between refresh operations.

The address constituents will be described with reference to FIGS. 4A and 4B. Although it is assumed that the X addresses in the case where the refresh counter circuit used in normal operation is employed for refreshing the redundancy area are A0, A1, A2, A10, A11, A12, A13, the address A13 is not included in the address constituents because it is selected at the same time that the refresh command is applied.

With the address constituents of the conventional refresh counter circuit shown in FIG. 4A, A0 to A12 of the X address are all used similarly in normal operation and in test operation of the redundancy area. Consequently, when the redundancy area is tested, the refresh counter circuit must perform counting operation even up to unnecessary addresses for which the redundancy area is not selected. In order to refresh all word lines of the redundancy area, refresh commands for the 13 bits A0 to A12, namely 8192 refresh commands, must be applied.

In this exemplary embodiment, as illustrated in FIG. 4B, the X addresses A0, A1, A2, A10, A11, A3, A4, A5, A6, A7, A8, A9 and A12 for selecting the redundancy area are used when the redundancy-area test mode is in effect. At the time of the redundancy test, A3 and A12 are interchanged and A0, A1, A2, A10, A11 and A12 are used as the six lower-order bits. The addresses of the six lower-order bits A0, A1, A2, A10, A11 and A12 from the side of the LSB are output successively as the count outputs of the refresh counter circuit. That is, the refresh counter circuit 19 is capable of counting and outputting only the X address necessary for the test of the redundancy area. When the six lower-order bits of A0, A1, A2, A10, A11 and A12 are output from the refresh counter circuit in the test of the redundancy-area, refresh of the word lines of the redundancy area is performed by a redundancy decoder circuit (not shown) and the normal area is not refreshed. Accordingly, higher-order bits A3, A4, A5, A6, A7, A8 and A9 of the refresh counter circuit are made "Don't Care" (i.e., the bits may take on any values).

Figure 5:
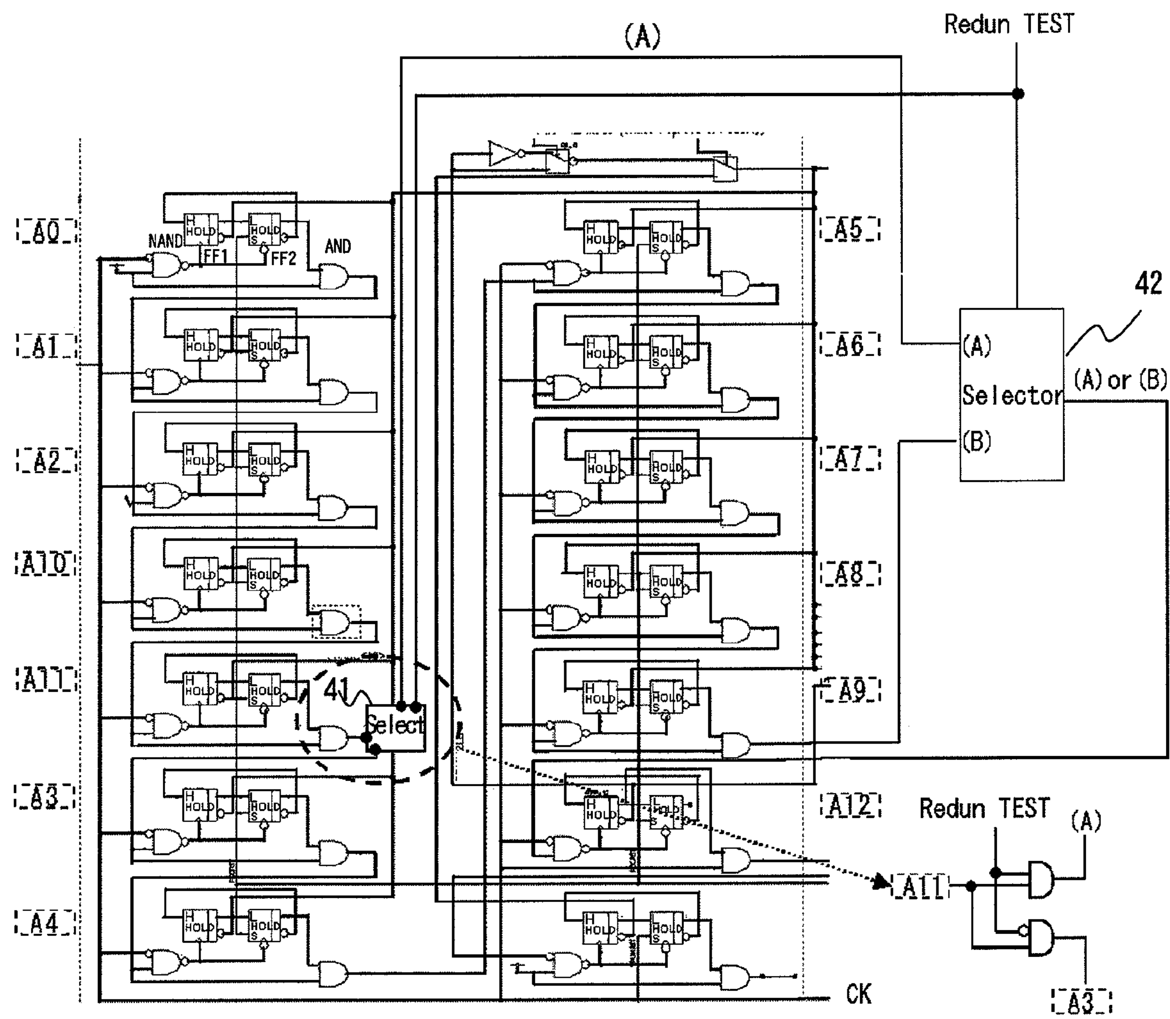
FIG. 5 is a diagram illustrating the configuration of a refresh counter circuit according to an exemplary embodiment of the present invention.

FIG. 5 is a diagram illustrating an example of the configuration of a refresh counter circuit according to an example of the present invention. As described with reference to FIG. 7C, a bit A12 (corresponding to X12 in FIG. 7C) are used to designate a block out of two memory blocks, and two bits A11 and A10 (respectively corresponding to X11 and X10 in FIG. 7C) are used to designate a memory mat among four memory mats in a bank. The 8 redundancy word lines in a redundancy area in a memory mat selected by A11 and A10 in a memory block selected by A12 are accessed by lower three bits (A2, A1, A0). The allocation of the redundancy area with regards to the row address space, is for example as follows:

(A) from #0000 to #0007 (A12=0) and from #1000 to #1007 (A12=1) for 2 sets of redundancy areas in a first memory mat in a bank;

(B) from #0400 to #0407 (A12=0) and from #1400 to #1407 (A12=1) for 2 sets of redundancy areas in a second memory mat in a bank;

(C) from #0800 to #0807 (A12=0) and from #1800 to #1807 (A12=1) for 2 sets of redundancy areas in a third memory mat in a bank; and (D) from #0C00 to #0C07 (A12=0) and from #1C00 to #1C07 (A12=1) for 2 sets of redundancy areas in a fourth memory mat in a bank.

The counter has a count output of the 13 bits A0, A1, A2, A10, A11, A3, A4, A5, A6, A7, A8, A9 and A12. It is noted that in this example, A0, A1, A2, A10, A11, A3, A4, A5, A6, A7, A8, A9 and A12 are respectively connected to the corresponding address input terminals of a row decoder not shown. That is, bits A10 and A11 of the refresh counter which are respectively located in third and fourth bits in place of A3 and A4 are connected to tenth and eleventh bits of address input terminals of the row decoder and bits A3 to A9 which are respectively located in fifth to eleventh bits are connected to third to ninth bits of address input terminals of the row decoder.

In the refresh counter, each bit has flip-flops in two stages, a NAND gate for receiving a clock CK and an output from the adjacent lower-order bit as inputs and supplying a sampling clock to the flip-flops, and an AND gate for delivering the non-inverted output of the flip-flop of the second stage to the NAND gate of the adjacent higher-order bit when the adjacent lower-order bit is logic "1". The inverted output of the first stage flip-flop FF1 of each bit is output as the count value. The inverted output (the output marked by the circle) of the second stage the flip-flop FF2 of each bit is fed back to the input of the first stage flip-flop of the first stage. The flip-flop of the second stage FF2 is set to "1" (HIGH) when the setting terminal S thereof is made "1" (HIGH). The flip-flop of the first stage FF1 samples its input (the inverted output of the flip-flop of the second stage) at the rising edge of the sampling clock from the NAND gate, and the flip-flop of the second stage samples its input (the non-inverted output of the flip-flop of the first stage) at the falling edge of the sampling clock from the NAND gate.

At the bit of A0, the NAND gate receives the clock CK and power supply potential VDD, and the AND gate receives a power supply potential VDD and an output of the flip-flop of the second stage are input to the AND gate. The flip-flop (FF1) of the first stage of the bit A0 toggles between "1" and "0" as the output value whenever the clock pulse CK is supplied thereto. More specifically, at the bit of A0, with the flip-flop (FF2) of the second stage in the set state, the flip-flop (FF1) of the first stage samples the inverted output "0" (=LOW) of the flip-flop (FF2) of the second stage responsive to the rising edge of the clock pulse CK, outputs "0" (=LOW) and outputs count value 1 of the bit of A0. The flip-flop of the second stage samples the non-inverted output "0" (=LOW) of the flip-flop (FF1) of the first stage at the falling edge of the clock pulse CK, outputs "0" (=LOW) to the AND gate from the non-inverted output and feeds back "1" (=HIGH) to the input of the flip-flop (FF1) of the first stage from the inverted output. At the rising edge of the next clock pulse CK, the flip-flop (FF1) of the first stage samples "1" and outputs count value 0. At the falling edge of the clock pulse, the flip-flop (FF2) of the second stage samples "0" and the output of the AND gate becomes "0". At the flip-flops of the other bits, the output of the AND gate of the adjacent lower-order bit is input to the AND gate and NAND gate, the "1" at the output of the AND gate of the adjacent lower-order bit is counted and the toggling takes place between "1" and "0" as the output value. As a result, a counting operation of 13 bits is performed.

In this exemplary embodiment, selectors 41 and 42 are provided. The output of A11 of the fifth bit from the LSB is supplied to the selector 41, which receives its output signal to the flip-flops of A3 of the adjacent sixth bit in normal operation and delivers its output signal to (A) when the redundancy-area is tested. The output (A) of the selector 41 and the output of the flip-flops of A9 are supplied to the selector 42, the output of which is supplied to the flip-flops of A12 in synchronization with the clock.

When the redundancy-area is tested (i.e., when a redundancy-area test mode signal Redun Test is HIGH), the selector 41 outputs the output of the flip-flops of A11 to the input (A) of the selector 42. The selector 42 selects (A) and supplies it to the flip-flops of A12. Accordingly, the six lower-order bits of A0, A1, A2, A10, A11 and A12 are output successively from the refresh counter.

In the present example, by counting up, for example responsive to a refresh command, from #0000 to #3F (from 0 to 63), the refresh counter is able to generate entire 64 row addresses for the above mentioned eight sets of redundancy areas in four memory mats in a selected bank, fully contiguously (that is, with no row address for the normal area being generated), in a redundancy-area test mode.

In normal operation (Redun Test=LOW), the selector 41 supplies the output of the flip-flops of A11 to the flip-flops of the adjacent A3. The selector 42 selects (B) and supplies the output of the flip-flops of A9 to the flip-flops of A12 of the adjacent bit. Accordingly, the arrangement performs a counting operation as a counter of the 12 bits of A0, A1, A2, A10, A11, A3-A9 and A12.

Figure 6:
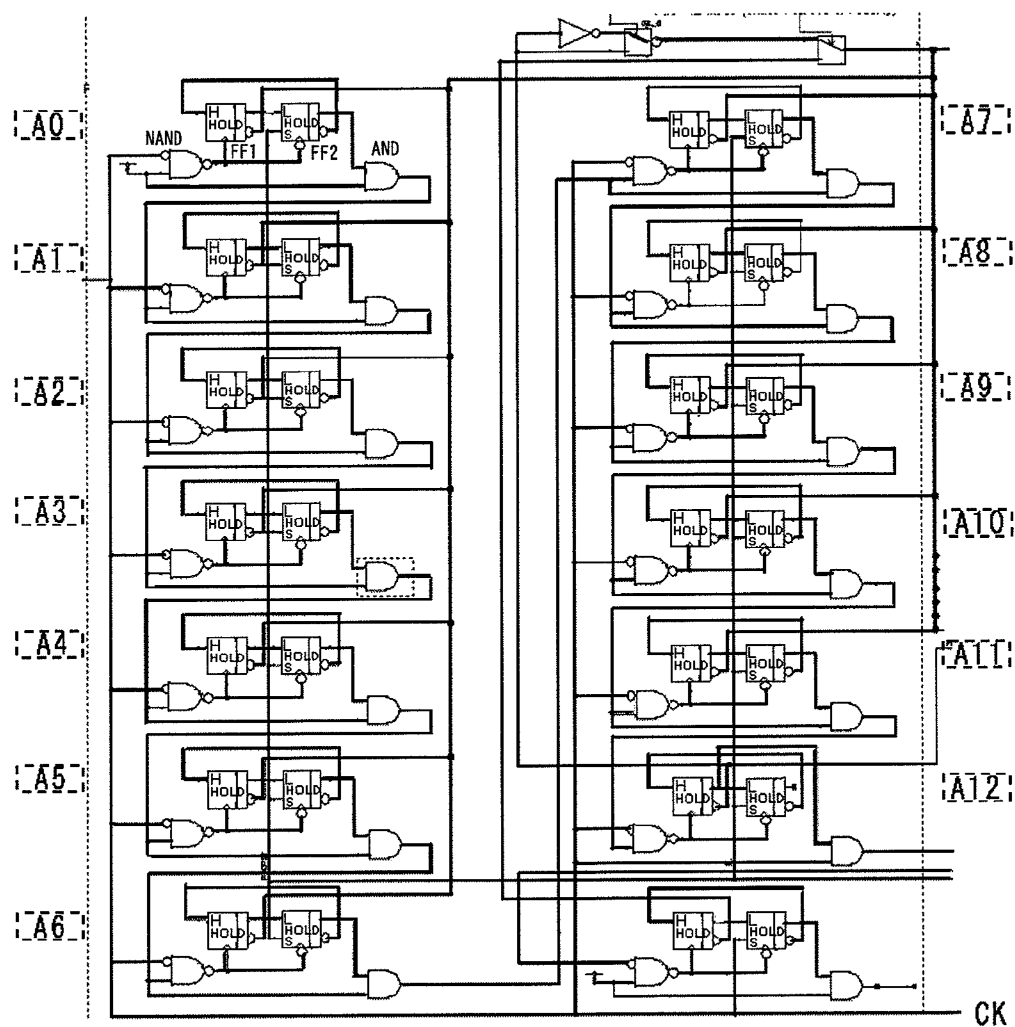
FIG. 6 is a diagram illustrating the configuration of a refresh counter circuit according to the related art.

FIG. 6 illustrates the configuration of a refresh counter circuit (13-bit counter) in which rearrangement of bits is not performed, as shown in FIG. 4A.

In this exemplary embodiment, owing to the simple arrangement having the selectors 41 and 42, the bits of the refresh counter circuit are rearranged when the redundancy area is tested. This shortens the time needed to test the redundancy area.

The entire disclosures of Patent Documents 1 to 3 are incorporated herein by reference thereto. The following analyses are given by the present invention.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

What is claimed is:

1. A semiconductor storage device comprising:

a cell array that includes a plurality of cells in a normal area and a plurality of redundant cells in a redundancy area for replacing faulty cells in the normal area, the cells being in need of refresh for data retention; and a refresh counter circuit that generates and outputs a refresh address for the cell array, the refresh counter circuit rearranging a bit arrangement of a count output thereof, when the redundancy area is subjected to a test, in such a manner that a refresh address for the redundancy area is reduced and placed on neighboring lower-order bits inclusive of the least significant bit (LSB) of a count-output of the refresh counter circuit.

2. The device according to claim 1, wherein, when the redundancy area is subjected to a test, refresh of word lines of the redundancy area is performed successively, based upon refresh addresses generated by the refresh counter circuit, owing to rearrangement of the address of the refresh counter circuit and refresh of the normal is not interposed between refresh operations of word lines of the redundancy area.

3. The device according to claim 1, wherein, when the redundancy area is subjected to a test, the refresh counter rearranges the bit arrangement thereof in such a manner that a predetermined neighboring higher-order bits of the count output used in an refresh address, for identifying the location in which the redundancy area which has a predetermined number of word lines is located, are placed adjacent to neighboring low bits inclusive of the LSB of the count output used in an refresh address, for selecting one word line of the redundancy, the location thereof being identified by the higher-order bits, and the refresh counter counts up, responsive to a refresh command supplied thereto to generate refresh addresses for a plurality of redundancy areas which are located separately with regard to row address space, contiguously.

4. The device according to claim 1, wherein the refresh counter circuit includes a changeover circuit that receives a redundancy-area test mode signal and that, when the redundancy area is subjected to a test, changes over a carry output from a flip-flop of a prescribed bit among a plurality of flip-flops that constitute the refresh counter circuit, in such a manner that the carry output is made available for use in counting by a flip-flop corresponding to adjacent higher-order bit of a row address of the redundancy area, without the carry output being provided as a count input to a flip-flop of a higher-order bit adjacent to the prescribed bit in normal operation.

5. A semiconductor storage device comprising:

a memory cell array including a normal memory cell area and a redundant memory cell area;

a refresh counter producing refresh address information, the refresh address information including a first address part having at least one first bit, a second address part having at least one second bit that is more significant than the first bit, and a third address part having at least one third bit that is more significant than the second bit; and an access circuit receiving the refresh address information and operating in a first mode to access the memory cell array with making the second part more significant than each of the first and third address parts and in a second mode to access the redundant memory cell area with making the first address part more significant than the second part and without using the third address part.

6. The device according to claim 5, wherein the memory cell array has a plurality of memory mats, each of the memory mats including a part of the normal memory cell area allocated thereto and a part of the redundant memory cell area allocated thereto, the second address part of the refresh address information being used to designate one of the memory mats and the first and third address parts of the refresh address information being used to designate at least one of memory cells contained in the part of the normal memory cell area allocated to the one of the memory mats.

7. The device according to claim 6, wherein the memory mats are classified into a plurality of memory blocks, each having plural ones of the memory mats, the refresh address information further including a fourth address part having at least one fourth bit that is more significant than the third bit, the fourth part of the refresh address information being used to designate one of the memory blocks.

8. The device as claimed in claim 7, wherein the access circuit accesses in the second mode the redundant memory cell area with further using the fourth address part.

9. A semiconductor storage device comprising:

a plurality of memory blocks, each of the memory blocks having a plurality of memory mats, each of the memory mats including a plurality of normal memory areas and a redundant memory area, each of the normal memory areas including a plurality of normal memory cells and a plurality of word lines, and the redundant memory area including a plurality of redundant memory cells and a plurality of redundant word lines;

an address decoder circuit making an access to the memory cell array in response to address information, the address information including a first address part designating one of the memory blocks, a second address part designating one of the memory mats, a third address part designating one of normal memory areas and at least one of the normal word lines of the one of the normal memory areas;

a refresh counter generating refresh address information, the refresh address information being changed in bit sequence from the least significant bit to the most significant bit, the refresh address information including a fourth address part inclusive of the least significant bit, a fifth address part inclusive of at least one more significant bit than the fourth address part, and a sixth address part inclusive of at least one more significant bit than the fifth address part, the fourth address part corresponding to a portion of the third address part, the fifth address portion corresponding to the second address part, and the sixth address part corresponding to a remaining portion of the third address part; and a test circuit activated in a test mode to perform a test operation on the redundant memory area in response to the refresh address information.

10. The device as claimed in claim 9, wherein the refresh address information further includes a seventh address part inclusive of at least one more significant bit than the sixth address part, and in the test mode, a portion of the sixth address part is exchanged by the seventh address part.

* * * * *